(12) United States Patent
Liu et al.

(10) Patent No.: US 8,906,595 B2
(45) Date of Patent: Dec. 9, 2014

(54) METHOD FOR IMPROVING RESIST PATTERN PEELING

(71) Applicant: Taiwan Semiconductor Manufacturing Company, Ltd., Hsin-Chu (TW)

(72) Inventors: Yu-Lun Liu, Beidou Township, Changhua County (TW); Chia-Chu Liu, Shin-Chu (TW); Kuei-Shun Chen, Hsin-Chu (TW); Chung-Ming Wang, Chiayi (TW); Chie-Chieh Lin, Luzhu Township, Taoyuan County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 23 days.

(21) Appl. No.: 13/666,107

(22) Filed: Nov. 1, 2012

(65) Prior Publication Data

US 2014/0120459 A1    May 1, 2014

(51) Int. Cl.
   *G03F 7/26*    (2006.01)
   *G03F 1/00*    (2012.01)

(52) U.S. Cl.
   CPC .................................... *G03F 1/00* (2013.01)
   USPC .......................................... 430/313; 430/314

(58) Field of Classification Search
   CPC ................... H01L 21/31144; H01L 21/76808; H01L 21/76807; H01L 21/32139; H01L 21/76802; H01L 21/0274; H01L 21/02282; H01L 21/308; H01L 21/312; G03F 7/094; G03F 7/091; G03F 7/0035; G03F 7/11
   USPC ................................. 430/313, 314, 323, 324
   See application file for complete search history.

(56) References Cited

U.S. PATENT DOCUMENTS

| 6,265,319 B1* | 7/2001 | Jang ............................... 438/723 |
| 2001/0021581 A1* | 9/2001 | Moon et al. ................... 438/637 |

* cited by examiner

*Primary Examiner* — Caleen Sullivan
(74) *Attorney, Agent, or Firm* — Haynes and Boone, LLP

(57) ABSTRACT

A method of fabricating a mask is described. The method includes receiving receiving an integrated circuit (IC) design layout that has a first pattern layer including a first feature and has a second pattern layer including a second feature, wherein the first pattern layer and the second pattern layer are spatially related when formed in a substrate such that the first and second features are spaced a first distance between a first edge of the first feature and a second edge of the second feature, modifying the IC design layout by adjusting a dimension of the first feature based on the first distance, and generating a tape-out data from the modified IC design layout for mask making. The method further includes applying a logic operation (LOP) to the IC design layout.

17 Claims, 7 Drawing Sheets

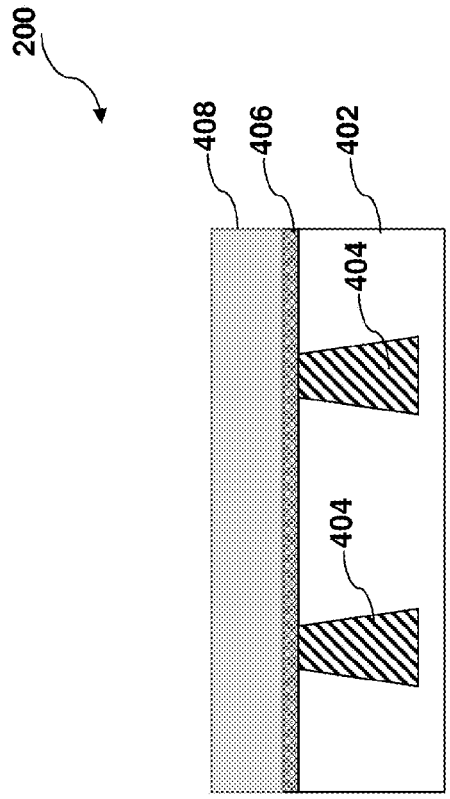
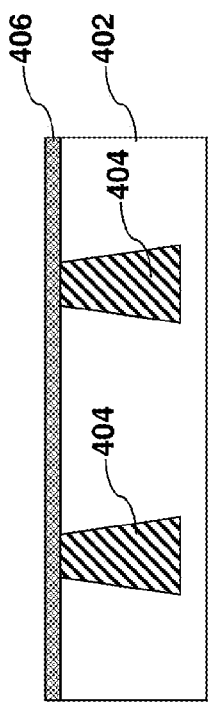
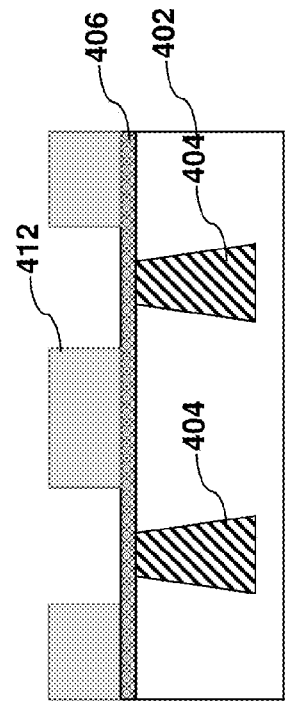
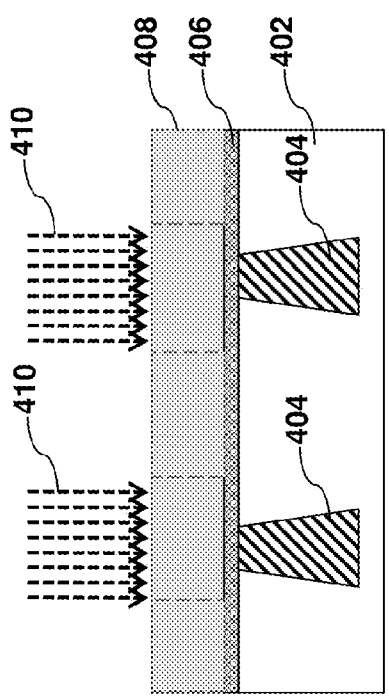

700

| Conditions | Y | Added value/side to designed demension of a resist pattern (second feature in layout) |
|---|---|---|
| X>300 nm or A < 220 nm | NA | 0 |
| X<300 nm and A>220 nm | <85 nm | 0 |
| X<300 and A>220 | >85 nm | 20 nm |
| X<300 nm and A>220 nm | >95 nm | 30 nm |

FIG. 11

METHOD FOR IMPROVING RESIST PATTERN PEELING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 4-7 are cross-sectional side views of forming a resist pattern of a device according to one or more embodiments.

FIG. 11 is an exemplary table adjusting a feature dimension for implementing one or more embodiments.

DETAILED DESCRIPTION

Figure 1:
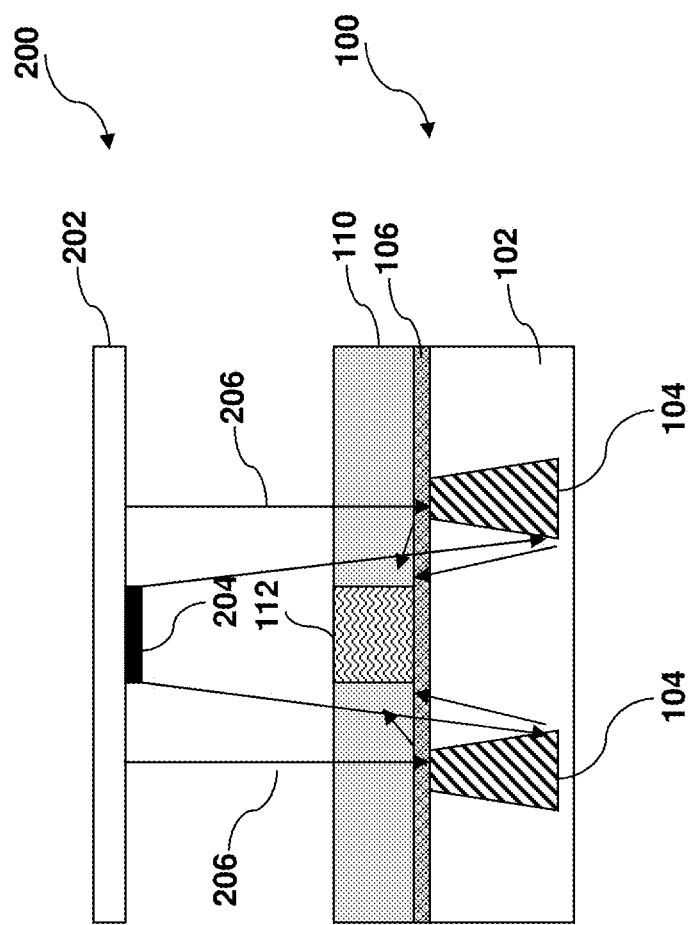
FIGS. 1 and 2 are cross-sectional side views of forming a resist pattern on a device according to one or more embodiments.

For example, lithography processes often implement exposing and developing processes to pattern small features during IC wafer fabrication and mask fabrication. One of the challenges that arise during the lithography processes is a resist pattern peeling with the feature size scaling down. The resist pattern peeling may interferer with an ion implantation process or an etching process, and may further impact the performance of the IC devices.

The following disclosure provides many different embodiments, or examples, for implementing different features of the invention. Specific examples of components and arrangements are described below to simplify the present embodiments. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that although the terms "first" and "second" may be used herein to describe various features, layers and/or regions, these features, layers and/or regions should not be limited by these terms. These terms are only used to distinguish one feature, layer or region from another feature, layer or region. Thus, a first feature, layer or region discussed below could be termed a second feature, layer or region, and similarly, a second feature, layer or region may be termed a first feature, layer or region without departing from the teachings of the present disclosure.

Figure 2:
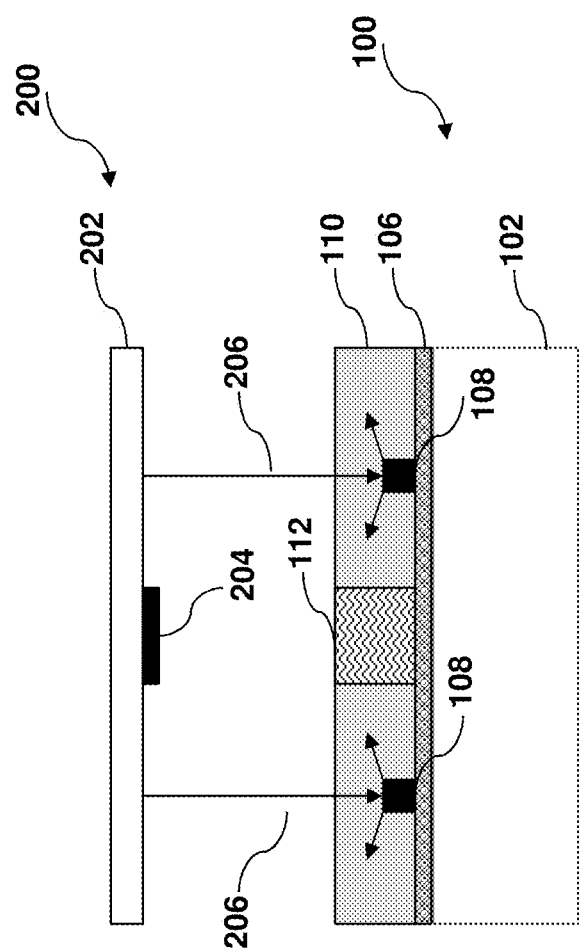

Referring now to FIGS. 1-2, cross-sectional side view examples of a semiconductor structure 100 having a resist pattern formed thereon using a mask 200 are illustrated according to various embodiments of the present disclosure. The semiconductor structure 100 includes a wafer substrate 102, a first feature 104 embedded in the substrate 102 (as shown in FIG. 1), an interfacial layer 106 disposed on the wafer substrate 102, and a second feature 108 disposed on the interfacial layer 106 (as shown in FIG. 2).

As shown in FIGS. 1 and 2, a resist film 110 is deposited on a wafer substrate 102, for example, by a spin on coating process. The resist film 110 is exposed using the mask 200 on an exposing tool. During an exposing process, a light is projected on the mask 200. Portion of the light is blocked or absorbed by a patterned opaque layer 204 formed on a mask substrate 202 and a patterned light 206 is projected to the resist film 110. A portion of the resist film 110 is not exposed by the patterned light 206. After a developing process, a non-exposed portion 112 remains and forms a resist pattern over the wafer substrate 102. However, because of topography and composition complexity of a wafer substrate, a resist pattern may be deviated from the expected pattern defined in the mask 200.

Continuing the present embodiments, the wafer substrate 102 may include a different material compared to the first feature 104 embedded in the wafer substrate 102, the first interfacial layer 106 disposed on the wafer substrate 102, or the second feature 108 disposed on the interfacial feature 106. For example, the wafer substrate 102 includes silicon, the first feature 104 includes silicon oxide, the interfacial layer 106 includes silicon oxide, and the second feature 108 may include poly silicon. A light may change traveling direction (be diffracted) when the light hit an interface between two different materials. The changing of light traveling direction may have severe impact on a resist pattern formed on a wafer substrate.

In one example, as shown in FIG. 1, the patterned light 206 changes traveling direction while hitting an interface between the first feature 104 and the interfacial layer 106, travels towards bottom of the wafer substrate 102, and changes the traveling direction again and travels toward the non-exposed portion 112 while hitting the bottom of the wafer substrate 102. A portion of the non-exposed portion 112 is exposed because of a light diffraction or reflection. The non-expected exposure may reduce dimension of a resist pattern and further cause peeling of the resist pattern.

In another example, as shown in FIG. 2, the patterned light 206 changes traveling direction and travels toward to the non-exposed portion 112 while hitting an interface between the second feature 108 disposed on the interfacial layer 106 and the resist film 110 deposited on the interfacial layer 106. A portion of the non-exposed portion 106 is exposed because of a light diffraction or reflection at the interface. The non-expected exposure may reduce dimension of a resist pattern and further cause peeling of the resist pattern.

Figure 3:
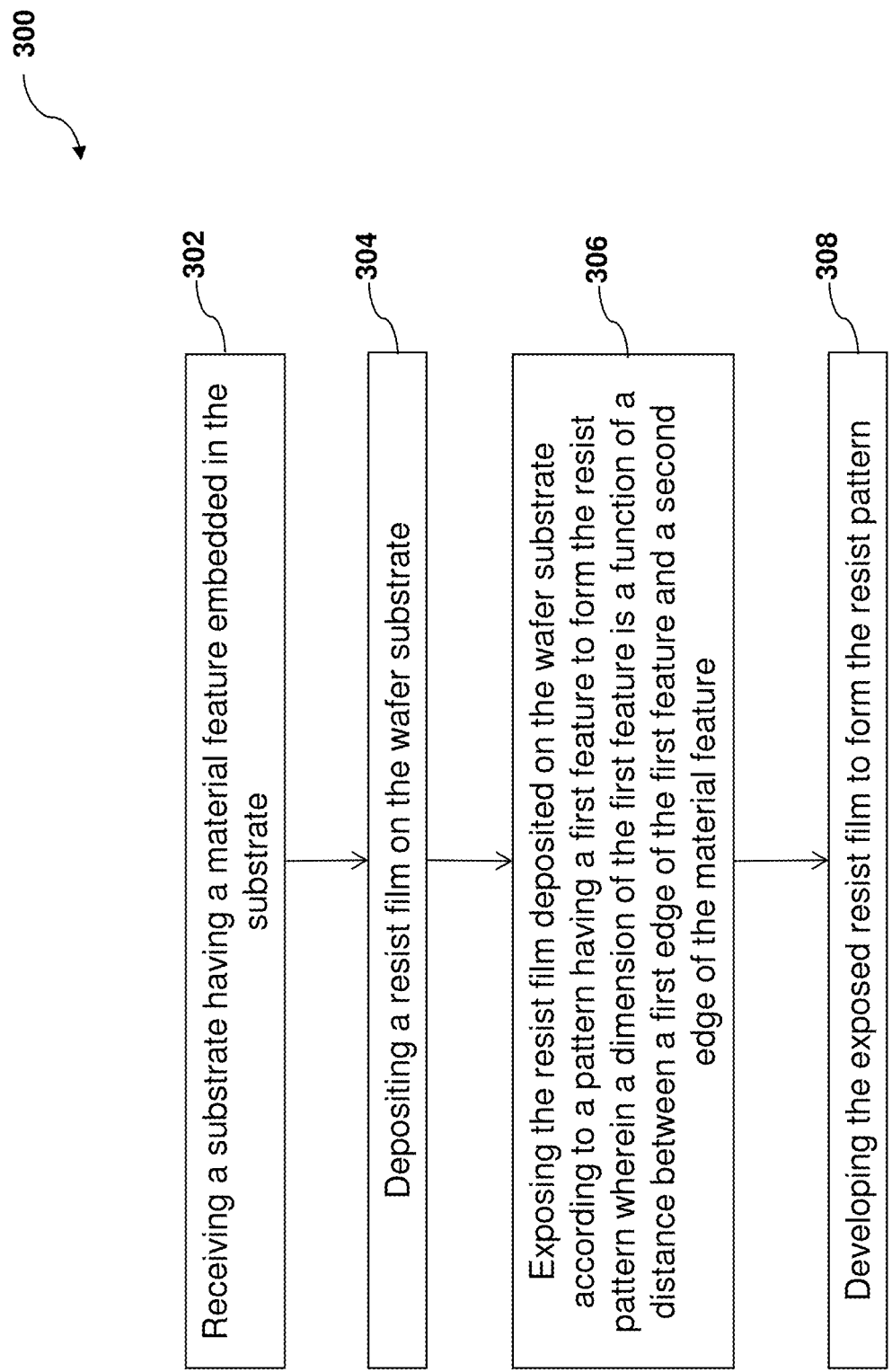
FIG. 3 is a flow chart of a method of forming a resist pattern for implementing one or more embodiments.

Referring to FIG. 3, a flow chart of a method 300 is one embodiment of forming a resist pattern on a substrate. FIGS. 4-7 are cross sectional views of a semiconductor structure 400 at various fabrication stages and fabricated by the method 300. The method 300 is described with the semiconductor structure 400 as an example for illustration.

The method 300 begins at operation 302 by providing or receiving a wafer substrate. The wafer substrate may include a wafer and a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the wafer is a semiconductor on insulator (SOI).

The wafer substrate further includes a plurality of features buried or embedded in the substrate. In the present embodiments, a feature buried or embedded in a wafer substrate is also referred to as a material feature or a material pattern. For example, the wafer substrate include various isolation features, such as shallow trench isolation (STI), formed by a process, such as a process including etching to form various trenches and then depositing to fill the trench with a dielectric material. The wafer substrate may include doped features, such as n-type wells and/or p-type wells, formed by ion implantation or diffusion or strained features formed by an epitaxial (EPI) growth. The wafer substrate also includes a plurality of conductive layers, non-conductive layers, or combination thereof as an interfacial layer. In the present embodiments, a material included in a feature buried in a wafer substrate is substantially different from a material included in the wafer substrate, and a material included in an interfacial layer is also substantially different from the wafer substrate. When a patterned electromagnetic radiation beam hitting an interface between the feature and the wafer substrate, a travelling direction of the patterned electromagnetic radiation beam may change. Referring to the example of FIG. 4, a wafer substrate 402, a material feature 404 buried in the wafer substrate 402, and an interfacial layer 406 deposited over the wafer substrate 402 and the material feature 404 are illustrated.

The method 300 proceeds to operation 304 by depositing a resist film on the wafer substrate, for example, by a spin-on coating process. A resist film may include a single resist layer or a multiple resist layers. A resist film may be a positive resist or a negative resist. The operation 304 may include performing a dehydration process before applying the resist film on the wafer substrate, which can enhance an adhesion of the resist film to the wafer substrate. The dehydration process may include baking the substrate at a high temperature for duration of time, or applying a chemical, such as hexamethyldisilizane (HMDS), to the substrate at high temperature. The operation 304 may also include a soft bake (SB), which drive solvents out of the resist film deposited on the wafer substrate and can increase mechanical strength of the resist film. The operation 304 may include applying a bottom anti-reflective coating (BARC) to reduce reflection and improve the resist pattern profile. FIG. 5 illustrates that a resist film 408 is deposited over the interfacial layer 406 and the wafer substrate 402 including the material feature 404.

The method 300 proceeds to operation 306 by exposing the resist film deposited on the wafer substrate by a radiation beam utilizing a photomask in an exposing tool. In an alternative embodiment, an electron beam is used to expose the resist film in an electron beam writer. In one embodiment, an optical exposing tool includes ultraviolet (UV) I-line light, deep ultraviolet (DUV) light, extreme ultraviolet (EUV) light, or X-ray exposing tool. In the example of the optical exposing tool, a photomask (mask or reticle) is needed. The mask includes a binary mask (BIM), or a phase shift mask (PSM). The phase shift mask may include an alternative phase shift mask (alt. PSM) or an attenuated phase shift mask (att. PSM). FIG. 6 illustrates the exposed the resist film 408 on the interfacial layer 406 and the wafer substrate 402, by a radiation beam 410.

The method 300 proceeds to operation 308 by developing the exposed resist film to form a resist pattern on the substrate. The operation 308 includes applying a developer, such as tetra-methyl ammonium hydroxide (TMAH), on the exposed resist film. The operation 308 may further include a post expose bake (PEB), a post develop bake (PDB), or both. The operation 308 may also include a final rinse process. Additional operations may be implemented before, during, and after the method 300, and some of the operations described may be replaced, eliminated, or moved around for additional embodiments of the method 300. The method 300 is one embodiment, and is not intended to limit the present invention beyond what is explicitly recited in the claims. Referring to the example of FIG. 7, a resist pattern 412 formed on the interfacial layer 406 and the wafer substrate 402 including the material feature 404 is illustrated.

In the present embodiments, a dimension of a resist pattern is determined by a dimension of the corresponding opening defined in the mask. However, the dimension of the resist pattern is impacted by diffraction, refraction, reflection of the radiation beam 410 at an interface between two different materials on and/or in a wafer substrate. Therefore, the dimension of the opening in the mask is adjusted to compensate or offset the impact on the dimension of the resist pattern caused by diffraction, refraction, reflection of the radiation beam 410 at an interface between two different materials on and/or in a substrate. Further, a resist pattern quality is improved by the adjustment of the dimension of the opening defined in the mask and associated with the radiation beam 410. The dimension of the resist opening pattern is compensated. Adjudging the dimension of the opening in the mask (accordingly the exposing radiation pattern) is implemented by adjusting the dimension of the corresponding feature in the IC design layout according to the pattern in another layer, which will be discussed in more detail later.

In the present embodiments, as shown in FIG. 7, the resist patterns 412 is formed on the interfacial layer 406 deposited over the wafer substrate 402 having the feature 406 buried in the wafer substrate 402.

Figure 8:
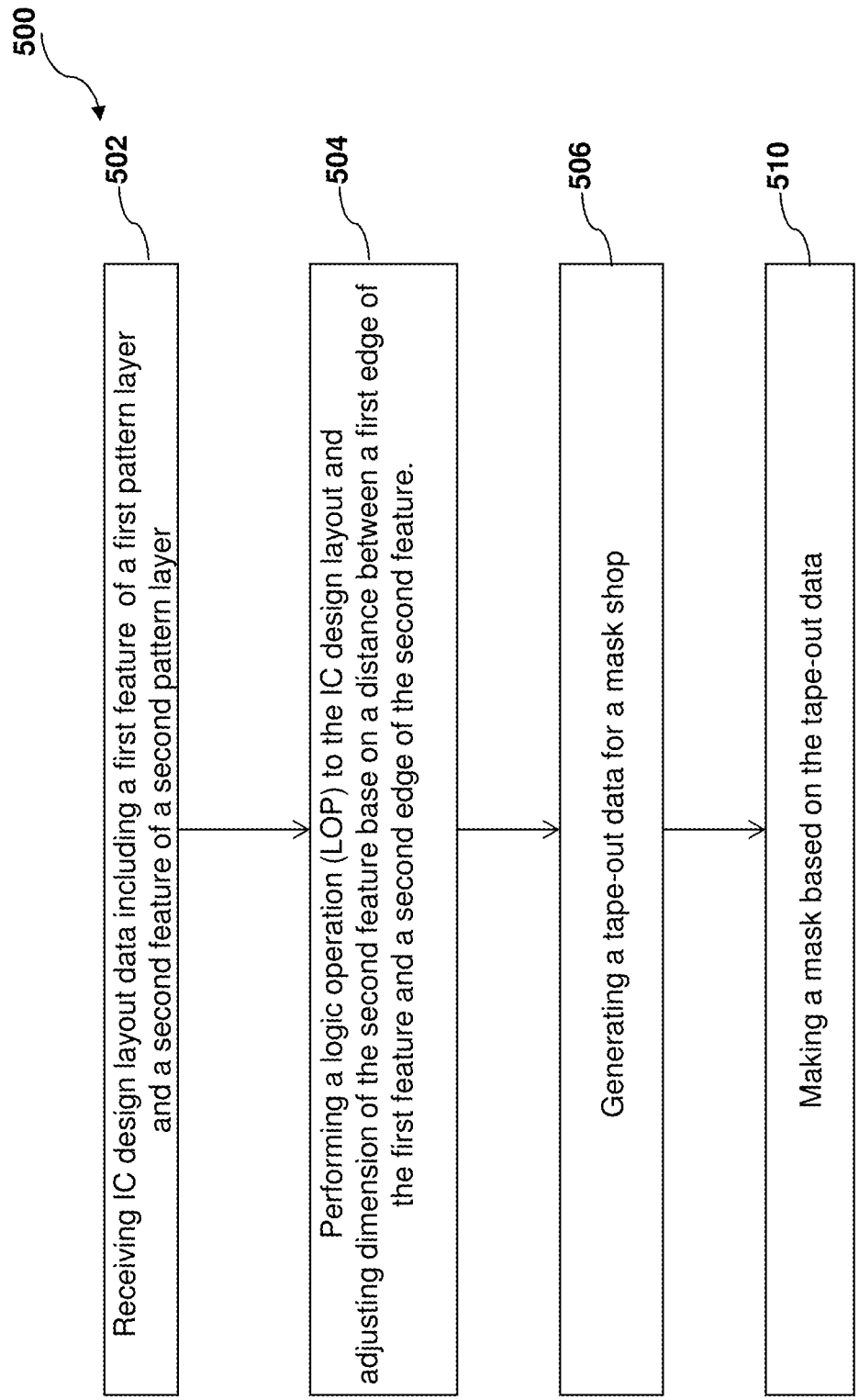
FIG. 8 is a flow chart of a method of forming a mask for implementing one or more embodiments.

Referring now to FIG. 8, a flow chat of a method 500 of fabricating a mask is illustrated for benefiting one or more embodiments. The method 500 begins at operation 502 by providing or receiving an IC design layout (or IC design layout data) from a designer. The designer can be a separate design house or can be part of a semiconductor fabrication facility (fab) for making IC productions according to the IC design layout. The IC design layout includes a plurality of main features (or features) designed for an IC product and based on a specification of the IC product. In the present embodiments, the IC design layout includes a first pattern layer having a first feature and a second pattern layer having a second feature. A feature is also referred to as a polygon.

The first pattern layer and the second pattern layer are spatially related when formed in a wafer substrate such that the first and second features are spaced a distance between a first edge of the first feature and a second edge of the second feature. The distance is measured in a top view toward the first and second pattern layers. In one embodiment, the first feature is corresponding to a material feature formed on or in a wafer substrates and the second feature is corresponding to a resist pattern to be formed over the material feature on the wafer substrate.

The method 500 proceeds to operation 504 by performing a logic operation (LOP) to the IC design layout such that the IC design layout is tuned with small bias corrections, which may be requested by a semiconductor fab according to the semiconductor manufacturing data. In the present embodiments, the operation 504 also includes identifying the second feature of the second pattern layer according to the first feature in the first pattern layer. The second feature in the second pattern layer is vertically overlying the first feature of the first pattern layer when formed on the wafer.

In the present embodiment, the LOP includes finding an adjustment to the dimension of the second feature according to the distance between the first edge of the first feature and the second edge of the second feature. In one embodiment, if a designed dimension of the second feature is greater than a first predetermined value or the distance between two adjacent second features is smaller than a second predetermined value, adjusting the designed dimension of the second feature is not needed. In this case, the adjustment is zero. In another embodiment, if the designed dimension of the second feature is less than the first predetermined value, the distance between the second feature and an adjacent feature in the second pattern layer is greater than the second predetermined value, and the distance between a first edge of the first feature and a second edge of the second feature is larger than a third predetermined value, a fourth predetermined value is added to the originally designed dimension of the second feature from each side. The adjusted dimension of the second feature X=X0+2D, wherein X0 is the originally designed dimension of the second feature and D is the fourth predetermined value. In this case, the adjustment is 2*D. The first, second, third, and fourth predetermined values may changes with a substrate, an exposing tool, or a resist film changing.

Figure 9:
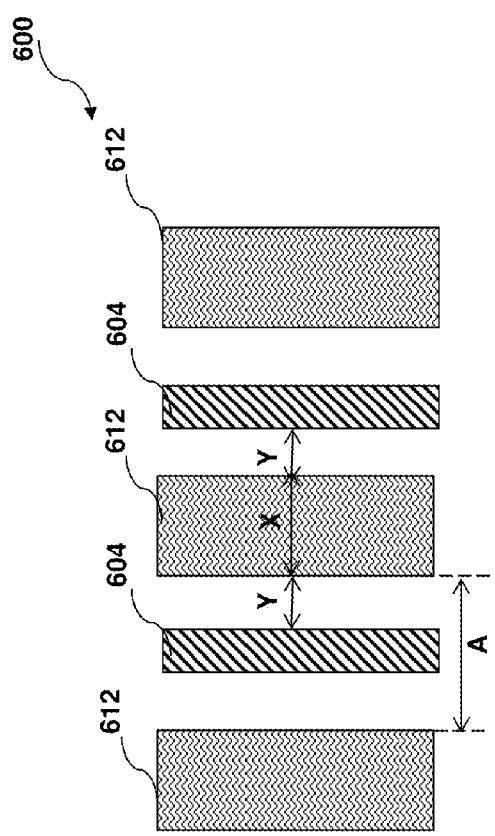
FIGS. 9 and 10 are examples of adjusting a feature dimension for implementing ore or more embodiments
Figure 10:
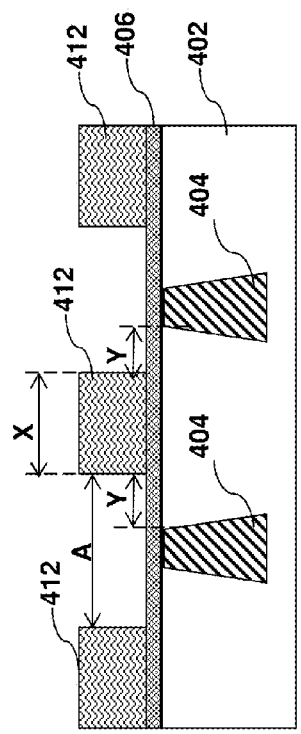

FIG. 9 is an exemplary IC design layout 600 according to one or more embodiments. FIG. 10 is an example of a semiconductor structure 650 associated with the design layout 600. The operation 504 is further explained with reference to FIGS. 9 and 10. The design layout 600 includes a first feature 604 of a first pattern layer and a second feature 612 of a second pattern payer. X is a designed dimension of the second feature 610. Y is a distance between a first edge of the first feature 604 and a second edge of the second feature 612 in a horizontal direction parallel to the first and second pattern layers when formed on the substrate. A is a distance between the two adjacent second feature 612.

FIG. 10 is an example of a semiconductor structure 650 associated with the design layout 600. The semiconductor structure 650 includes the wafer substrate 402, the material feature 404 buried in the wafer substrate 402, the interfacial layer 406 deposited over the wafer substrate 402 and the material feature 404, and the resist pattern 412 formed over the interfacial layer 406 and the material feature 404. The material feature 404 of device 650 associates with the first feature 604 of the layout 600 while formed in wafer a substrate. The resist pattern 412 of the device 650 associates with the second feature 612 of the layout 600 while formed on a substrate. The semiconductor structure 650 is provided for illustration and it is to be understood that there might be a dimensional discrepancy between a feature in the design layout 600 and a corresponding feature in the semiconductor structure 650.

In one embodiment, if the designed dimension X of the second feature 612 is larger than a first predetermined value or the distance A between the two adjacent second features 612 is smaller than a second predetermined value, adjusting the designed dimension X of the second feature 612 is not needed. In other words, the fourth predetermined value D is zero.

In another embodiment, if the designed dimension X of the second feature 612 is smaller than a first predetermined value, the distance A between the two adjacent second features 612 is larger than a second predetermined value, and the distance Y between the first edge of the first feature 604 and the second edge of the second feature 612 is smaller than a third predetermined value, adjusting the designed dimension X of the second feature 610 is not needed. In other words, the fourth predetermined value D is zero.

In an alternative embodiment, if the designed dimension X of the second feature 612 is smaller than the first predetermined value, the distance A between the two adjacent second features 612 is larger than the second predetermined value, and the distance Y between the first edge of the first feature 604 and the second edge of the second feature 612 is larger than a third predetermined value, adjusting the designed dimension X of the second feature 612 by adding the fourth predetermined value D to each side of the second feature 612 is performed. The fourth predetermined value D is a function of the distance Y between the first edge of the first feature 604 and the second edge of the second feature 612.

In one embodiment, dimension of a resist pattern is controlled by adjusting dimension of an associated feature on a mask used on an exposing tool, for example, a scanner or a stepper. In another embodiment, dimension of a resist pattern may be controlled by adjusting dimension of an associated patterned radiation beam on an exposing tool, for example, an electron beam writer.

Referring to FIG. 11, a table 700 illustrating various examples of adjustments to the designed dimension of a resist pattern. The table 700 provides various embodiments of the LOP for the adjustment at the operation 504. The table 700 is described with further reference to FIGS. 9-10. In one example, if the designed dimension X is larger than 300 nm or the distance A is smaller than 220 nm, adjusting the dimension X by adding zero is performed. In other words, no adjustment is needed. In another example, if the designed dimension X is smaller than 300 nm, the distance A is larger than 220 nm, and the distance Y is smaller than 85 nm, adjusting the dimension X by adding zero is performed. In other words, no adjustment is needed. In an alternative example, if the designed dimension X is smaller than 300 nm, the distance A is larger than 220 nm, and the distance Y is larger than 85 nm, adjusting the designed dimension X by adding 20 nm to each side of the designed dimension X is performed. In other words, 40 nm is added to the designed dimension X. In one example, If the designed dimension X is smaller than 300 nm, the distance A is larger than 220 nm, and the distance Y is larger than 95 nm, adjusting the designed dimension X by adding 30 nm to each side of the dimension X is performed. In other words, 60 nm is added to the designed dimension X.

Referring back to FIG. 8, the operation 504 includes adjusting the dimension of the second feature of the second pattern layer. Particularly, the adjustment to the dimension of the second feature is based on the originally designed dimension of the second feature, the distance between the second feature and an adjacent feature in the second pattern layer, and distance between a first edge of the first feature and a second edge of the second feature. In the present embodiments, adjusting a dimension of a feature is implemented at an operation in which an optical proximate correction (OPC) is applied to the IC design layout.

The method 500 proceeds to operation 506 by generating a tape-out data for a mask shop to fabricate a mask using the modified IC design layout. The mask shop may be part of a semiconductor fab making an IC device, or an independent mask making shop.

The method 500 may include an operation 510 by making a mask according to the tape-out data. The operation 510 includes fracturing the tape-out data into a plurality of essential rectangles or trapezoids. Creating a plurality of design layout patterns on the mask is carried out by a mask writer, for example, an electron beam writer, an ion beam writer, or a laser beam writer. In one embodiment, the mask includes a transparent substrate, such as fused quartz, calcium fluoride ($CaF_2$), or other suitable material. The mask layer also includes an opaque layer patterned according to the modified IC design layout. The opaque layer includes an opaque material, such as chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), or other suitable materials. In another embodiment, the mask is reflective mask for EUV lithography technology. In this embodiment, the mask substrate may include a low thermal expansion material (LTEM). The mask substrate serves to minimize image distortion due to mask heating by the intensified illumination radiation. Multiple material layers, such as alternating Mo/Si films, are formed on the LTEM substrate and patterned according to the modified IC design layout.

The operation 510 may include performing an inspection on features formed on the mask substrate for quality control and assurance. The operation 510 may include repairing the mask if a printable defect is found on the mask. The operation 510 may further include installing a pellicle over the features formed on the mask substrate to prevent a particle from falling on the features formed on the mask substrate. Additional operations can be provided before, during, and after the method 500, and some the operations described can be replaced, eliminated, or moved around for additional embodiments of the method 500. The method 500 is example embodiments, and is not intended to limit the present invention beyond what is explicitly recited in the claims.

Thus, a method of fabricating a mask is described. The method includes receiving an integrated circuit (IC) design layout that has a first pattern layer including a first feature and has a second pattern layer including a second feature, wherein the first pattern layer and the second pattern layer are spatially related when formed in a substrate such that the first and second features are spaced a first distance between a first edge of the first feature and a second edge of the second feature, modifying the IC design layout by adjusting a dimension of the first feature based on the first distance, and generating a tape-out data from the modified IC design layout for mask making. The method further includes applying a logic operation (LOP) to the IC design layout.

In one embodiment, a method of making a resist patterned is presented. The method includes receiving a substrate having a material feature embedded in the substrate, depositing a resist film on the substrate and the material feature, and exposing the resist film according to a design pattern having a first feature to form the resist pattern overlaying the material feature on the substrate, wherein first feature and the material feature are spatially related, the resist pattern and the material feature are spaced a first distance between a first edge of the first feature and a second edge of the material feature in a top view. The first feature has a dimension that is a function of the first distance. The method further includes developing the exposed resist film deposited on the substrate.

In another embodiment, a method of forming a resist pattern is described. The method includes receiving a substrate having a material feature buried in the substrate, depositing a resist film on the substrate and the material feature, and exposing the resist film according to a mask having a first feature to form the resist pattern overlaying the material feature on the substrate. The first feature and the material feature are spatially related. The first feature and the substrate pattern are spaced a first distance between a first edge of the resist pattern and a second edge of the material feature. A dimension of first feature is a function of the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a resist pattern, the method comprising:
    receiving a substrate having a material feature embedded in the substrate;
    depositing a resist film on the substrate and the material feature; and
    exposing the resist film according to a design pattern having a first feature to form the resist pattern overlaying the material feature on the substrate, wherein the first feature and the material feature are spaced a first distance between a first edge of the first feature and a second edge of the material feature in a top view, wherein the first feature has a dimension that is a function of the first distance;
    wherein the dimension of the first feature is increased by a first value when the first distance is larger than a first predetermined value.

2. The method of claim 1, further comprising developing the exposed resist film deposited on the substrate.

3. The method of claim 1, wherein the exposing the resist film includes applying one of a light beam, an electron beam and an ion beam.

4. The method of claim 3, wherein the applying of the optical beam includes using a mask.

5. The method of claim 1, wherein the first value is zero when the dimension of the first feature is larger than a second predetermined value.

6. The method of claim 5, wherein the first value is zero when the a second distance between the first feature and an adjacent feature is smaller than a second predetermined value.

7. A method of forming a resist pattern, the method comprising:
    receiving a substrate having a material feature buried in the substrate;

depositing a resist film on the substrate and the material feature; and exposing the resist film according to a mask having a first feature to form the resist pattern overlaying the material feature on the substrate, wherein the first feature and the material feature are spatially related;

the first feature and the substrate pattern are spaced a first distance between a first edge of the resist pattern and a second edge of the material feature; and a dimension of first feature is a function of the first distance;

wherein the dimension of the first feature is adjusted by adding a value when the first distance is larger than a first predetermined value.

8. The method of claim 7, further comprising developing the exposed resist film deposited on the substrate.

9. The method of claim 7, wherein the value is a function of the first predetermined value.

10. The method of claim 7, wherein the value is zero when the dimension of first feature is larger than a second predetermined value.

11. The method of claim 7, wherein the value is zero when a second distance between two adjacent resist patterns is smaller than a second predetermined value.

12. A method, comprising:

receiving a substrate having a material feature embedded in the substrate;

forming a resist pattern overlaying the material feature on the substrate, wherein the resist pattern includes a first feature, wherein the first feature and the material feature are spaced a first distance between a first edge of the first feature and a second edge of the material feature in a top view, and wherein the first feature has a dimension that is a function of the first distance;

wherein the dimension of the first feature is increased by a first value when the first distance is larger than a first predetermined value.

13. The method of claim 12, wherein forming the resist pattern includes exposing a resist film by applying one of a light beam, an electron beam and an ion beam.

14. The method of claim 13, further comprising developing the exposed resist film deposited on the substrate.

15. The method of claim 13, wherein the applying of the optical beam includes using a mask.

16. The method of claim 12, wherein the first value is zero when the dimension of the first feature is larger than a second predetermined value.

17. The method of claim 16, wherein the first value is zero when the a second distance between the first feature and an adjacent feature is smaller than a second predetermined value.

* * * * *